US008742342B2

(12) United States Patent
Okai et al.

(10) Patent No.: US 8,742,342 B2
(45) Date of Patent: Jun. 3, 2014

(54) ELECTRON MICROSCOPE

(75) Inventors: Nobuhiro Okai, Kokubunji (JP); Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/505,951

(22) PCT Filed: Nov. 1, 2010

(86) PCT No.: PCT/JP2010/006424
§ 371 (c)(1),
(2), (4) Date: May 3, 2012

(87) PCT Pub. No.: WO2011/055520
PCT Pub. Date: May 12, 2011

(65) Prior Publication Data
US 2012/0217393 A1 Aug. 30, 2012

(30) Foreign Application Priority Data
Nov. 6, 2009 (JP) ................. 2009-254553

(51) Int. Cl.
*H01J 37/04* (2006.01)
*H01J 37/145* (2006.01)
*H01J 37/14* (2006.01)

(52) U.S. Cl.
CPC ................. *H01J 37/04* (2013.01); *H01J 37/14* (2013.01); *H01J 37/145* (2013.01); *H01J 2237/121* (2013.01)
USPC .......................................... 250/310

(58) Field of Classification Search
CPC ................. H01J 37/04; H01J 37/14
USPC .......................................... 250/310
See application file for complete search history.

(56) References Cited

U.S. PATENT DOCUMENTS

| 5,250,808 | A * | 10/1993 | Danilatos et al. ............. 250/310 |
| 6,747,279 | B2 * | 6/2004 | Adamec ................. 250/396 ML |
| 8,461,526 | B2 * | 6/2013 | Mankos et al. ................. 250/307 |
| 2004/0056207 | A1 * | 3/2004 | Petrov et al. ........... 250/396 ML |
| 2006/0060790 | A1 * | 3/2006 | Nakasuji et al. ........... 250/423 F |
| 2007/0057183 | A1 * | 3/2007 | Arai et al. ..................... 250/310 |

(Continued)

FOREIGN PATENT DOCUMENTS

| JP | 60-65967 U | 5/1985 |
| JP | 63-64255 A | 3/1988 |
| JP | 2003-521096 A | 7/2003 |
| JP | 2006-54094 A | 2/2006 |

(Continued)

OTHER PUBLICATIONS

Corresponding International Search Report with English Translation dated Dec. 14, 2010 (four (4) pages).

*Primary Examiner* — Jack Berman
*Assistant Examiner* — James Choi
(74) *Attorney, Agent, or Firm* — Crowell & Moring LLP

(57) ABSTRACT

A scanning electron microscope suppresses a beam drift by reducing charging on a sample surface while suppressing resolution degradation upon observation of an insulator sample. An electron microscope includes an electron source and an objective lens that focuses an electron beam emitted from the electron source, which provides an image using a secondary signal generated from the sample irradiated with the electron beam. A magnetic body with a continuous structure and an inside diameter larger than an inside diameter of an upper pole piece that forms the objective lens is provided between the objective lens and the sample.

14 Claims, 11 Drawing Sheets

(56) References Cited

U.S. PATENT DOCUMENTS

| | | |
|---|---|---|
| 2007/0057617 A1* | 3/2007 | Coyle et al. .................... 313/446 |
| 2009/0256076 A1* | 10/2009 | Fukuda et al. ................. 250/311 |
| 2011/0139996 A1* | 6/2011 | Chen et al. ............. 250/396 ML |
| 2012/0145917 A1* | 6/2012 | Chen et al. .................... 250/398 |

FOREIGN PATENT DOCUMENTS

| | | |
|---|---|---|
| JP | 2009-259444 A | 11/2009 |
| WO | WO 01/56056 A2 | 8/2001 |
| WO | WO 2007/119873 A1 | 10/2007 |
| WO | WO 2007119873 A1 * | 10/2007 |

* cited by examiner

ELECTRON MICROSCOPE

TECHNICAL FIELD

The present invention relates to an electron microscope.

BACKGROUND

A scanning electron microscope is configured to accelerate electrons emitted from an electron source of thermal type or field emission type to form a thin electron beam (primary electron beam) using an electrostatic lens or a magnetic lens, subject the primary electron beam to two-dimensional scanning on a sample surface to be observed, detect a secondary signal, for example, secondary electron or backscattered electron secondarily generated from the sample resulting from radiation of the primary electron beam, and set the detected signal intensity to a brightness modulation input of a cathode-ray tube which is scanned simultaneously with scanning of the primary electron beam so as to provide a two-dimensional scan image. The use of the scanning electron microscope for the process of fabricating semiconductor devices or inspection after completion (for example, critical dimension measurement or electric performance inspection) has demanded high resolution equal to 10 nm or lower at a low accelerating voltage of 1 kv or lower, which allows observation by reducing charging of an insulator.

The method for short focusing by bringing a principal plane of an objective lens close to the focal point has been generally conducted as one of solutions. The method generally called semi-in-lens type has a magnetic pole structure in which the sample is positioned below upper and lower pole pieces of the objective lens so as to positively immerse the sample in the magnetic field. The magnetic pole structure of semi-in-lens type allows space below the objective lens so that a larger sample is handled compared with the in-lens type in which the sample is disposed between the upper and the lower pole pieces. The structure has been widely distributed for the use in the inspection apparatus of the semiconductor wafer.

In the semi-in-lens type magnetic pole structure, high magnetic field is likely to act on the sample surface, which significantly influences a secondary electron trajectory of the secondary electron and backscattered electron generated when irradiating the sample with the electron beam. There are various types of objects to be observed using the scanning electron microscope. Especially when observing the insulator sample, the electron beam radiation generates the secondary electron and the backscattered electron to charge the sample surface, resulting in various types of image degradation. Recently, use of the scanning electron microscope has been increasingly required to observe the sample, for example, reticle which is likely to be charged by the electron beam radiation. Therefore, there is a pressing need to take appropriate measure. Especially, charging makes the potential on the sample surface non-uniform around the electron beam radiation point to generate potential gradient. This may deflect the electron beam trajectory to cause the beam drift phenomenon and an accompanying image blur.

The scanning electron microscope disclosed in Patent Literature 1 is configured to set an incident energy of the electron beam so that a secondary electron emission yield becomes 1 or higher to bring the sample surface into a positively charged state, and control the surface potential distribution in accordance with configurations of the flat-plate electrode and a sample holder for charging control, which are disposed between the sample surface and the objective lens. This makes it possible to observe the reticle and the like. The aforementioned art is effective for the reticle observation, but is difficult to completely remove the influence of charging. Especially for the sample which has the charging state largely changed depending on the incident beam energy, for example, the reticle having the surface coated with resist, stable measurement precision cannot be established. Further reduction of charging is required in order to improve the measurement precision.

The scanning electron microscope disclosed in Patent Literature 2 is configured to provide a magnetic disc independent from the objective lens around a pole piece gap (upper pole piece and lower pole piece) of the objective lens to improve the magnetic field generation efficiency of the objective lens. This may reduce power consumption of the exciting coil as well as the stray magnetic field to the sample surface, which allows observation of the insulator sample with high resolution and high precision by reducing charging. However, the configuration disclosed in Patent Literature 2 significantly degrades the resolution, and does not disclose the specific configuration of the magnetic disc efficient for the charging reduction.

Patent Literature 3 discloses the configuration having the magnetic body disposed below the objective lens. According to Patent Literature 3, the deflector is disposed below the objective lens to generate the magnetic field for beam deflection in order to establish a large incident angle on the sample surface without causing the large deflection of the charged particle beam. The lateral magnetic field is generated using the exciting coil. A deflector pole piece (magnetic plate) is provided to concentrate the generated magnetic field around the optical axis efficiently. However, since the art disclosed in Patent Literature 3 is intended to deflect the beam, the deflector pole piece has four cut portions that constitute four poles, each of which is provided with the exciting coil. The electrodes just above the sample are not rotationally symmetric completely but divided into segments. The electron beam receives the different force in each direction, thus degrading the resolution. As the configuration of the pole piece is not rotationally symmetric, the charging is generated non-symmetrically, and accordingly, the beam drift is emphasized.

The above-described related arts are effective for charging of the insulator sample. However, such effect is limited, and consideration with respect to resolution degradation is insufficient.

CITATION LIST

Patent Literature

Patent Literature 1: Japanese Patent Application Laid-Open Publication No. 2006-54094
Patent Literature 2: WO2007-119873
Patent Literature 3: Japanese Patent Application Laid-Open Publication (Translation of PCT Application) No. 2003-521096

SUMMARY OF INVENTION

Technical Problem

The present invention is intended to provide an image with minimized blur by suppressing the beam drift generated by charging on the sample surface.

Solution to Problem

The present invention provides an electron microscope which includes an electron source and an objective lens that focuses an electron beam emitted from the electron source, which provides an image using a secondary signal generated from a sample irradiated with the electron beam. A magnetic body with a continuous structure and an inside diameter larger than an inside diameter of an upper pole piece that forms the objective lens is provided between the objective lens and the sample.

In the electron microscope, the magnetic body has a rotationally symmetric opening at a substantially center location, through which the electron beam passes.

In the electron microscope, the magnetic body is a flat plate.

In the electron microscope, an outside diameter of the magnetic body is larger than an inside diameter of a lower pole piece that forms the objective lens.

In the electron microscope, the magnetic body is a pure iron or a permalloy.

In the electron microscope, the magnetic body and the objective lens are arranged so that respective central axes are substantially coincided with each other.

In the electron microscope, a non-magnetic body is provided in addition to the magnetic body between the objective lens and the sample.

In the electron microscope, the non-magnetic body has a rotationally symmetric opening at substantially a center location, through which the electron beam passes.

In the electron microscope, the non-magnetic body is a flat plate.

In the electron microscope, an inside diameter of the non-magnetic body is smaller than the inside diameter of the upper pole piece that forms the objective lens.

In the electron microscope, an outside diameter of the non-magnetic body is larger than an outside diameter of the magnetic body.

In the electron microscope, the non-magnetic body is disposed at a position closer to the sample than the magnetic body.

In the electron microscope, the non-magnetic body has a trench that stores the magnetic body so that the magnetic body is disposed therein.

In the electron microscope, the objective lens, the non-magnetic body and the magnetic body are arranged so that respective central axes are substantially coincided with one another.

In the electron microscope, the electron beam passes through a region between a center of a magnetic lens formed of the objective lens and the magnetic body and a center of an electrostatic lens formed of the objective lens and the non-magnetic body.

In the electron microscope, the electron microscope is a scanning electron microscope.

The present invention provides an electron lens of an electron microscope used for inspection and measurement of a sample. A magnetic body with a continuous structure and an inside diameter larger than an inside diameter of an upper pole piece that forms an objective lens is provided between the objective lens and the sample.

Advantageous Effects of Invention

The structure according to the present invention is capable of providing an image with minimized blur by suppressing the beam drift generated through charging on the sample surface.

DESCRIPTION OF EMBODIMENTS

First Embodiment

Figure 1:
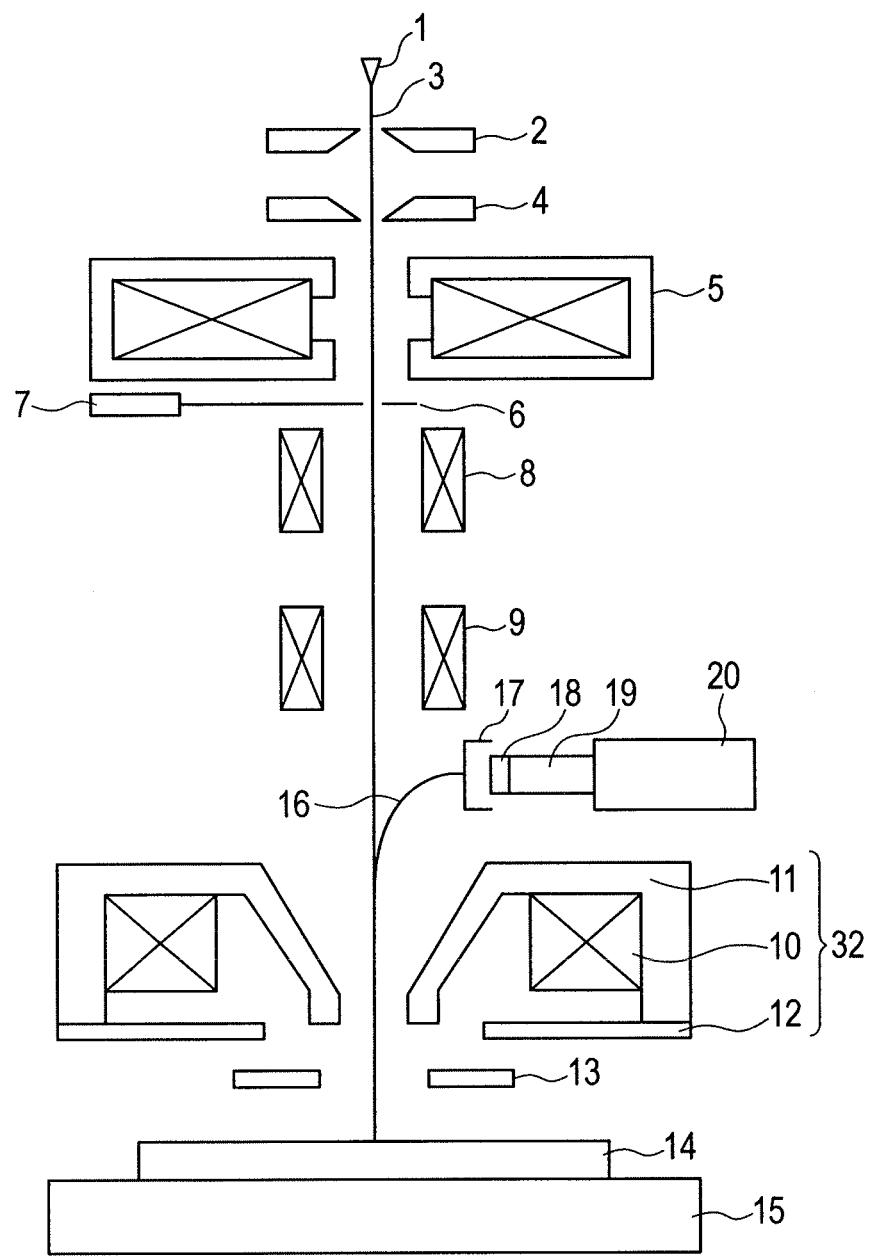
FIG. 1 is a schematic view of an embodiment according to the present invention.

Embodiments of the present invention will be described referring to the drawings.

FIG. 1 is a schematic view of an electron microscope according to an embodiment. This embodiment is intended to conduct measurement and inspection of the interconnection on the wafer with respect to a large sample such as a semiconductor wafer under the condition where energy of a primary electron beam is set at low acceleration voltage ranging from several 100 eV to several keV. The present invention is applicable to the electron microscope irrespective of larger intended sample or object, and higher acceleration voltage so long as it has the similar structure.

When applying an extraction voltage between a field emission cathode 1 and an extraction electrode 2 as an electron source, an emitted electron 3 is released. The emitted electron 3 is further accelerated between the extraction electrode 2 and an anode 4 at a ground potential. Energy (acceleration voltage) of the electron beam passing through the anode is accorded with the acceleration voltage of an electron gun. A primary electron beam passing through the anode is subjected to a scanning deflection through a condenser lens 5, an upper scan deflector 8, and a lower scan deflector 9, and is further accelerated by an upper pole piece 11 of an objective lens 32 to which a positive voltage is applied. The accelerated primary electron beam is narrowed to be thin on the sample by the objective lens 32. The objective lens 32 is formed of an objective lens coil 10, the upper pole piece 11 and a lower pole piece 12, and is configured to immerse the magnetic field generated by the objective lens coil 10 from the gap between the upper and the lower pole pieces so as to be converged on the optical axis, and to focus the electron beam. Intensity of the magnetic lens 32 is adjusted by changing the current of the objective lens coil 10. The primary electron beam passing through the objective lens 32 is decelerated in a deceleration electric field between the objective lens 32 and a sample 14 so as to reach the sample 14. In this configuration, the acceleration voltage of the primary electron when passing through the objective lens 32 becomes higher than the final acceleration voltage. In comparison with the case where the primary electron beam at the final acceleration voltage passes through the objective lens 32, the chromatic aberration in the objective lens 32 is reduced, and thinner electron beam is obtained, thus establishing the high resolution. An aperture angle of the primary electron beam of the objective lens 32 is determined by a diaphragm 6 disposed below a condenser lens. An adjustment knob 7 is operated for centering of the diaphragm. Referring to the drawing, the adjustment is mechanically performed. However, electrostatic or magnetic field deflector may be disposed to the front and rear of the diaphragm to perform the adjustment by deflecting the electron beam.

The thin electron beam narrowed by the objective lens 32 is scanned on the sample by the upper scan deflector 8 and the lower scan deflector 9. Deflection directions and intensities of the upper scan deflector 8 and the lower scan deflector 9 are adjusted so that the scanned electron beam always passes through the center of the objective lens 32. The sample 14 is fixed onto the sample holder 15.

A secondary electron 16 is generated as a result of irradiating the sample 14 with the primary electron beam. The deceleration electric field generated by the objective lens 32 and the sample 14 serves as the acceleration electric field to the secondary electron. It is then pulled into a passage of the objective lens 32, and moves upward while being influenced by the lens effect in the magnetic field of the objective lens 32. The secondary electron that has passed in the objective lens 32 is pulled by a lateral electric field of a pull-up electrode 17 disposed between the objective lens 32 and the lower scan deflector 9, and further passes through the mesh of the pull-up electrode. It is then accelerated by a scintillator 18 to which 10 kv (positive potential) is applied. The scintillator 18 is then illuminated. The emitted light is guided to a photomultiplier 20 by a light guide 19, and converted into an electric signal. An output of the photomultiplier is further amplified to a brightness modulation input to the cathode-ray tube (not shown).

The magnetic body 13 according to the invention is disposed between the lower pole piece 12 of the objective lens 32 and the sample 14. The magnetic lens of semi-in-lens type is structured to immerse the magnetic field to the direction of the sample 14 so as to establish high resolution. The magnetic body 13 allows change in the distribution of the immersing magnetic field while retaining the high resolution. The magnetic field distribution may be arbitrarily changed in accordance with the shape and size of the magnetic body 13. Preferably, the material for forming the magnetic body 13 exhibits high saturation magnetic flux density, for example, pure iron and permalloy so as to serve as a part of the objective lens 32. It has to be formed of metal to avoid charging by the electron beam.

The magnetic body 13 is provided apart from the objective lens 32 (space between the magnetic body 13 and the lower pole piece 12) as shown in FIG. 1 so as to increase magnetic resistance to the objective lens 32. This makes it possible to guide the stray magnetic field from the pole piece to the magnetic body 13, and to improve the magnetic field strength on the optical axis more efficiently than the case without the magnetic body 13 where the unnecessary magnetic field is formed in the space. The magnetic body has the disc shape to use the axisymmetrical magnetic field of the objective lens 32 without asymmetry. The magnetic body 13 is provided apart from the objective lens 32 with the space therebetween as it is necessary to avoid magnetic saturation caused by guiding unnecessarily strong magnetic field, and to prevent large change in optimally designed property of the objective lens of semi-in-lens type that intrinsically exhibits no magnetic body. Even if the thickness of the magnetic body is reduced for taking the magnetic field attenuated in the space independently from the objective lens, no magnetic saturation occurs, and the magnetic field is not immersed from the surface of the magnetic body at the sample side. The resultant effect of shielding the immersed magnetic field to the sample is significantly enhanced.

The outside diameter of the magnetic body is designed to be larger than the inside diameter of the lower pole piece of the objective lens for the purpose of efficiently taking the magnetic field generated by the objective lens into the magnetic body. If the outside diameter of the magnetic body is smaller than the inside diameter of the lower pole piece of the objective lens, the magnetic field of the objective lens may be immersed from the resultant gap therebetween. If the magnetic field is immersed in this region, unnecessary magnetic field component is generated on the sample surface, which changes the trajectory of the emitted electron generated by the electron beam radiation. It is necessary to increase the amount of current of the exciting coil for the purpose of retaining the target magnetic field strength upon decrease in the magnetic field strength on the optical axis. Use of the magnetic body results in one of advantages of a reduced amount of current of the exciting coil. The aforementioned configuration may fail to utilize the advantage. Therefore, the outside diameter of the magnetic body has to be designed to be larger than the inside diameter of the lower pole piece of the objective lens.

Figure 2:
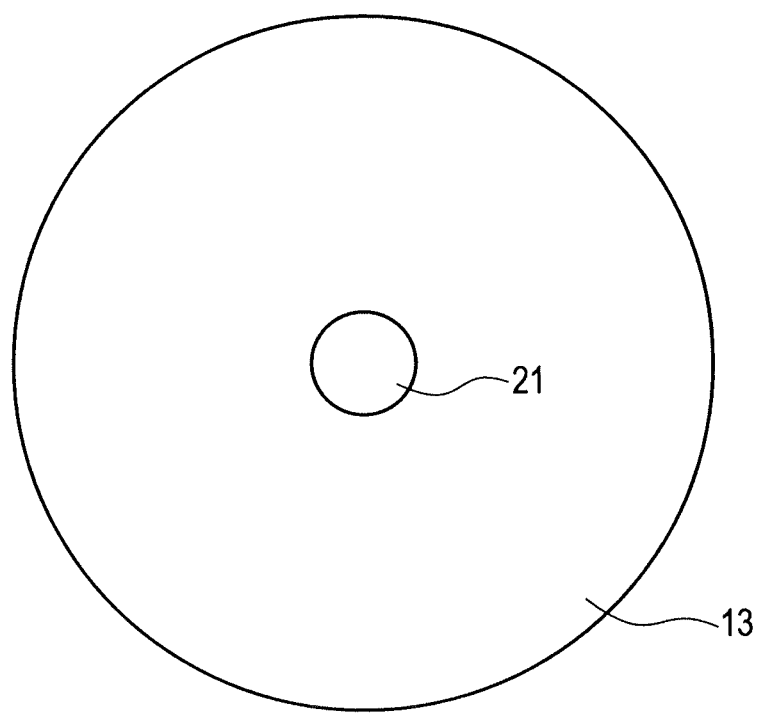
FIG. 2 is a plan view of a magnetic body.

FIG. 2 is a plan view of the magnetic body according to the present invention. Referring to FIG. 2, the magnetic body 13 has a hole 21 for electron beam passage at its center. The hole 21 for electron beam passage is opened in a rotationally symmetric manner so as not to change the configuration of the electron beam. The magnetic body is continuously formed with no hole other than the one for electron beam passage. The term "rotationally symmetric" represents that the configuration is kept unchanged even if it is rotated at an arbitrary angle with respect to the center axis. As a result, the magnetic field generated around the sample maintains excellent rotationally symmetric property, and is unlikely to cause aberration owing to asymmetric magnetic field that will lead to resolution degradation.

If an opening other than the hole for electron beam passage occurs, a part other than the target portion (hole for electron beam passage) may be immersed in the magnetic field generated by the objective lens 32, and accordingly, sufficient effect of shielding immersion of the sample in the magnetic field cannot be obtained. Preferably, the magnetic body has the rotationally symmetric hole for electron beam passage as the opening and the rest of the part continuously structured. The magnetic body that functions as the electrode is used for stabilizing the potential on the sample surface. It is preferable for the magnetic body to be configured as shown in FIG. 2.

Figure 3A:
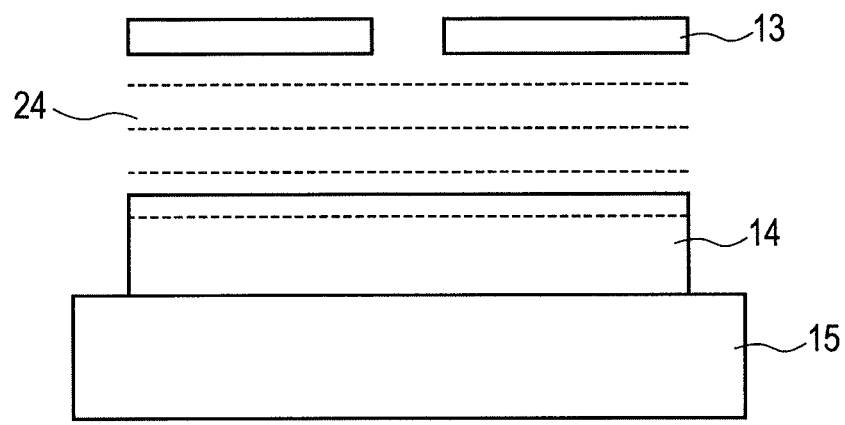
FIGS. 3A and 3B are views illustrating equipotential lines around a sample in accordance with the magnetic body configuration.
Figure 3B:
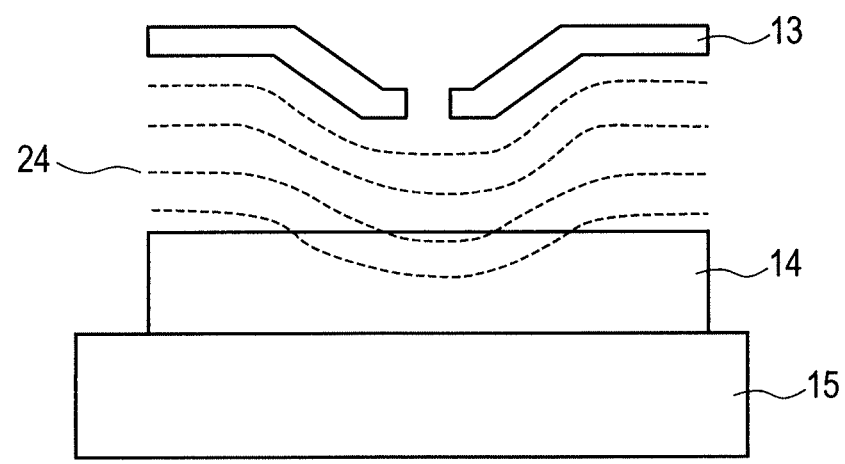

As described above, the magnetic body functions as the electrode, and influences the potential distribution on the sample surface. The potential distribution relative to the different planar structure has been described. The potential distribution relative to the different three-dimensional conformation will be described hereinafter. FIGS. 3A and 3B are views schematically representing the change in the equipotential line on the sample surface with the change in the shape of the magnetic body. FIG. 3A represents the equipotential line in the state where the magnetic body has a flat shape relative to the sample surface. FIG. 3B represents the equipotential line in the state where the magnetic body has an uneven shape relative to the sample surface. Assuming that the sample 14 is entirely formed of the insulator, the potential distribution around the sample is determined by shapes of the magnetic body and the sample holder. If the magnetic body 13 has the flat shape relative to the sample surface, the potential distribution on the sample surface is uniform thereon. The equipotential line 24 is parallel to the sample surface, thus causing no potential gradient. Meanwhile, if the magnetic body shown in FIG. 3B has the uneven shape relative to the sample surface, the equipotential line is not parallel to the sample surface, thus generating the potential gradient which may cause the beam drift. Preferably, the magnetic body has a flat surface opposite the sample with no unevenness. The other surface that is not opposite the sample may have the uneven or slope shape as it has no impact on the potential distribution on the sample surface.

Figure 4:
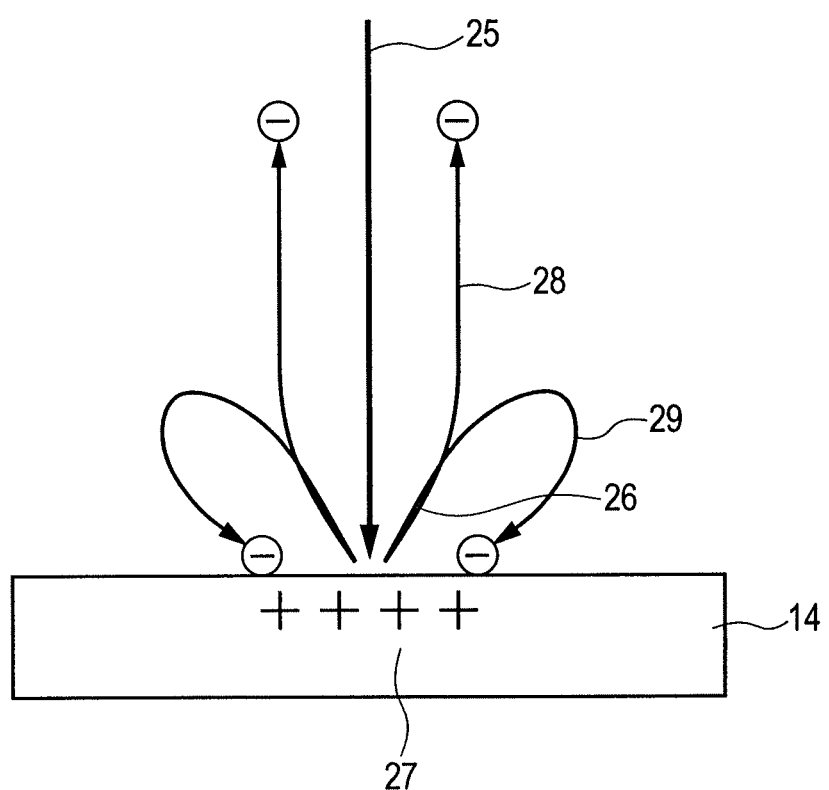
FIG. 4 is a view representing generation and relaxation of positive charging on the sample surface accompanied with incidence of an electron beam.

First of all, principle for forming charging on the sample surface upon electron beam radiation will be described. FIG. 4 schematically illustrates the sample surface in the charged state when it is irradiated with the electron beam. The charging on the sample surface may be calculated based on the electron balance. Generally, energy of the incident electron to the sample is set to 1 keV or lower. In spite of slight difference depending on the material for forming the sample, the sample surface is brought into a positively charged state 27 owing to insufficient electron as the amount of generated secondary electron 26 through incidence of the electron beam 25 to the sample 14 is larger than the number of incident electrons. The generated secondary electron 26 may be classified into a component 29 that is returned to reach the positively charged sample surface in addition to a component 28 that moves away from the sample 14 to reach a detector disposed above. The electron 26 generated by the sample is actively returned to the sample to allow reduction of the positive charging caused by the electron beam radiation. The magnetic body 13 is disposed to change the magnetic distribution around the sample, and the trajectory of the emitted electron is changed accordingly. The positive charge formed on the sample may be reduced by returning the secondary electron with negative charge to the sample.

Figure 5A:
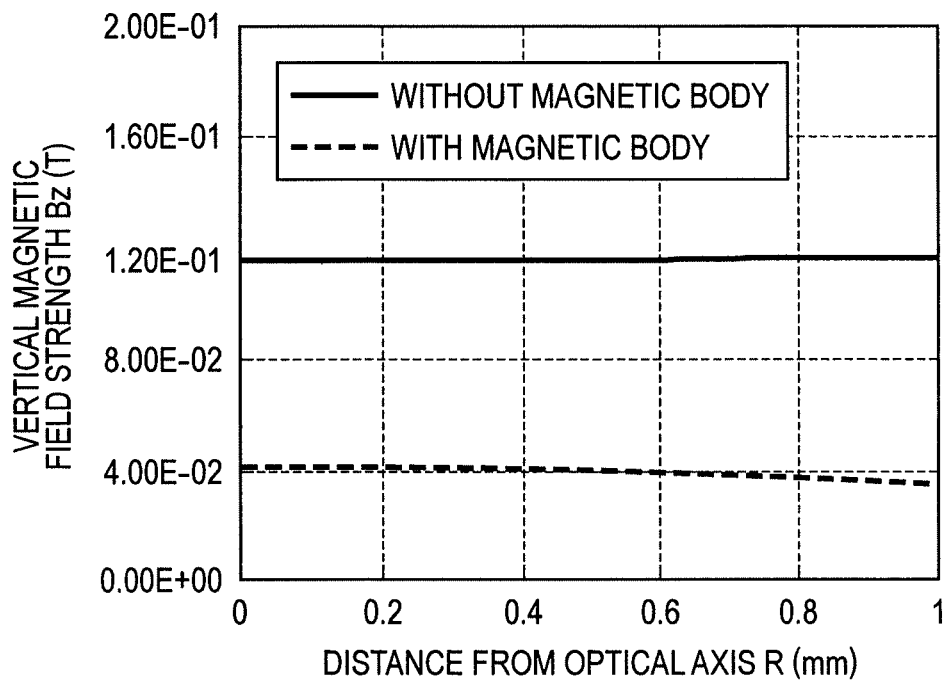
FIGS. 5A and 5B are graphs each representing the change in a magnetic field strength in both cases where the magnetic body is provided and not provided.
Figure 5B:
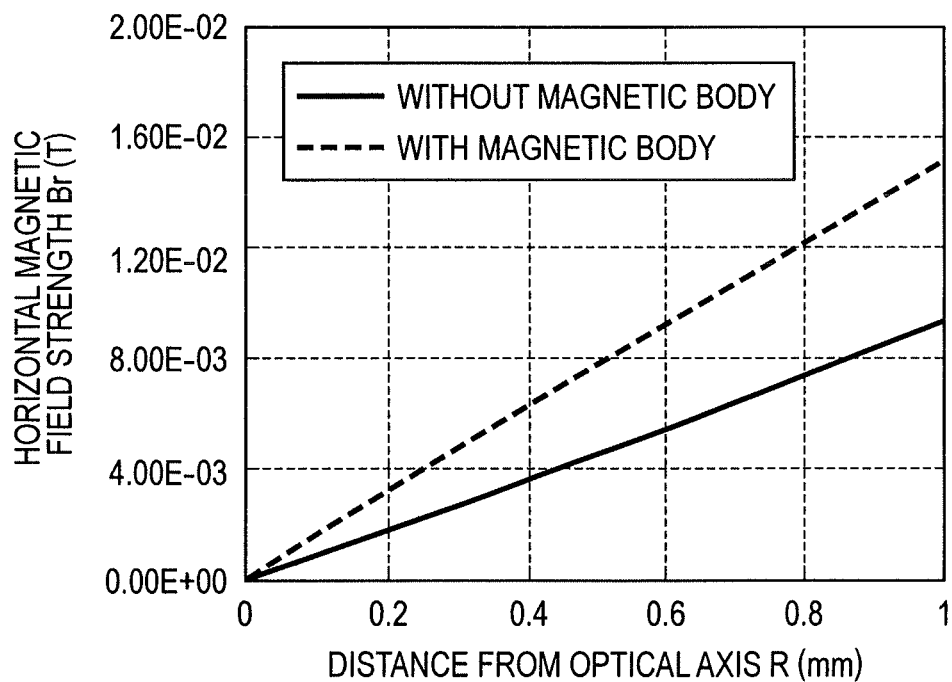
Figure 6A:
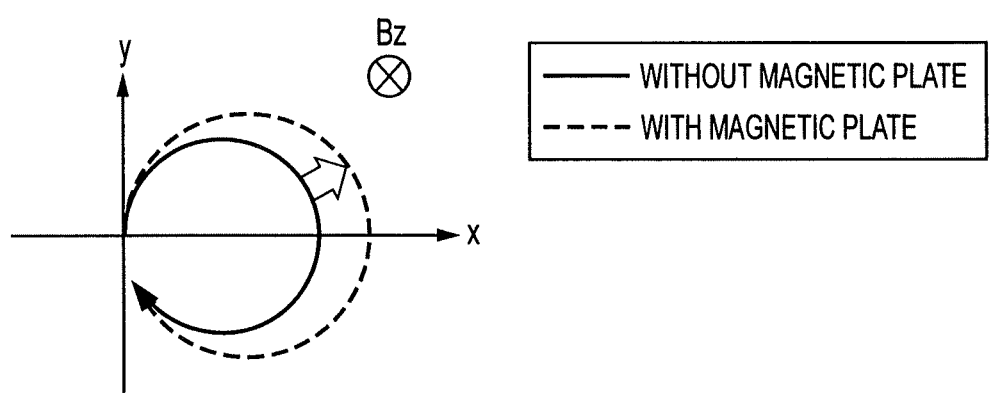
FIGS. 6A and 6B are views representing the change in the electron trajectory in both cases where the magnetic body is provided and not provided.
Figure 6B:
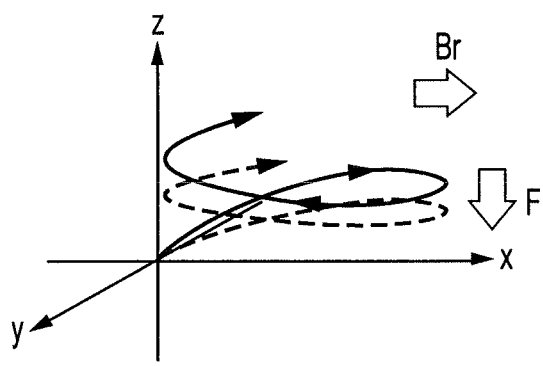

The principle for reduction of charging by providing the magnetic body 13 will be described. FIGS. 5A and 5B show the change in the magnetic field distribution around the optical axis in accordance with the state where the magnetic body is provided or not provided. The inside diameter of the magnetic body is set to be the same as that of the upper pole piece of the objective lens. An x-axis R (mm) denotes a distance from the optical axis, and each of y-axes shown in FIGS. 5A, 5B denotes a vertical component Bz and a horizontal component Br of the magnetic field strength, respectively. When the magnetic body is provided, the strength of the component Bz is low, and the strength of the component Br is high. The components Bz and Br change the trajectory of the emitted electron as described below. Referring to schematic views of FIGS. 6A and 6B, the component Bz has a magnitude with respect to a direction of the sample. The electron emitted from the sample surface is influenced by the magnetic field to perform cyclotron motion clockwise. As FIG. 6A shows, when the component Bz is reduced by providing the magnetic body, the cyclotron radius becomes large. That is, a range of the emitted electron outputted from the sample surface becomes large. Meanwhile, the component Br has a magnitude to the direction away from the optical axis. The electron emitted from the sample surface is influenced by the magnetic field to receive Lorentz force in the direction of the sample, and lands on the sample. Referring to FIG. 6B, when the component Br is increased by providing the magnetic body, Lorentz force to the direction of the sample becomes large, which facilitates landing of the emitted electron on the sample. Provision of the magnetic body allows mutual effect between the components Bz and Br, thus facilitating landing of the emitted electrons on the sample surface. This makes it possible to reduce positive charging more strongly.

Figure 7:
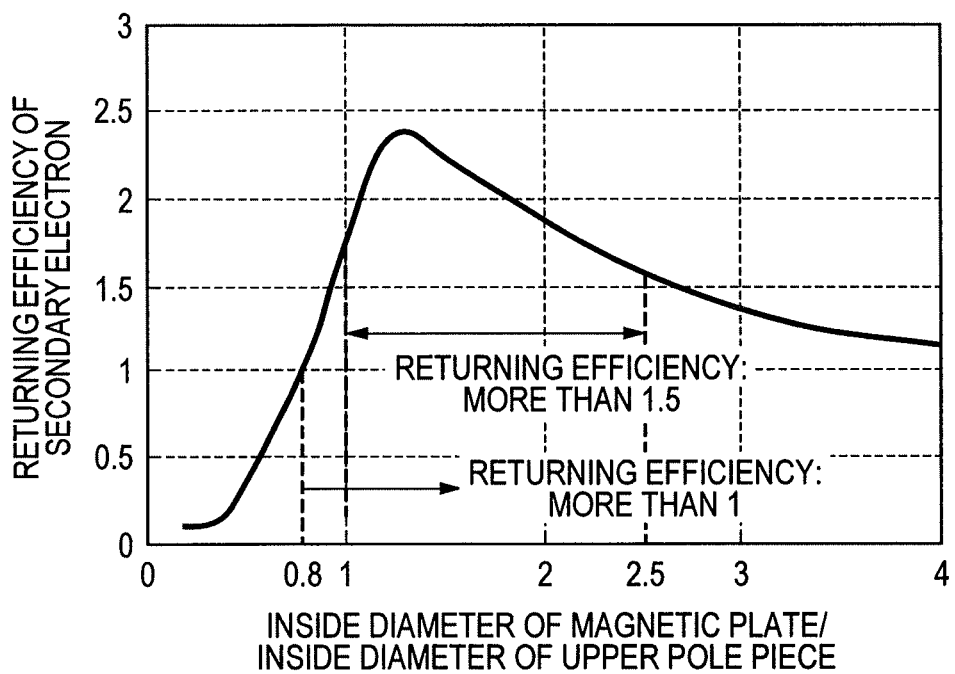
FIG. 7 is a graph representing a relationship between an inside diameter of the magnetic body and a returning efficiency of a secondary electron.

The magnetic field distribution shown in FIGS. 5A and 5B is significantly influenced by the inside diameter of the magnetic body, which changes the trajectory of the emitted electron. FIG. 7 shows the calculation result with respect to amount of the emitted electron returning to the sample surface by changing the inside diameter of the magnetic body. The x-axis denotes the inside diameter of the magnetic body relative to the inside diameter of the upper pole piece of the objective lens, and y-axis denotes the ratio of returning amount of the emitted electron standardized as the configuration without the magnetic body. Referring to the drawing, the returning amount of the emitted electrons to the sample surface is maximized at a point where the inside diameter of the magnetic body is larger than the inside diameter of the upper pole piece. As the inside diameter is further increased, the returning efficiency of the emitted electron is gradually decreased. Meanwhile, as the inside diameter of the magnetic body is decreased, the returning efficiency of the emitted electron is sharply reduced. The effect of emphasizing reduction of charging realized by provision of the magnetic body is established in the region where the returning efficiency of the secondary electron is equal to or higher than 1, that is, the ratio of the inside diameter between the magnetic body and the upper pole piece is equal to or higher than 0.8. When the returning efficiency of the secondary electron is equal to or higher than 1.5, the charging reduction effect becomes noticeable. This is established in the range of the ratio of inside diameter between the magnetic body and the upper pole piece from 1 to 2.5. It is preferable to set the ratio of inside diameters between the magnetic body and the upper pole piece to be in the range from 1 to 2.5 to ensure the charging reduction effect by providing the magnetic body. However, the charging reduction effect may be obtained by setting the inside diameter ratio to 0.8 or higher, thus reducing the beam drift.

Figure 8:
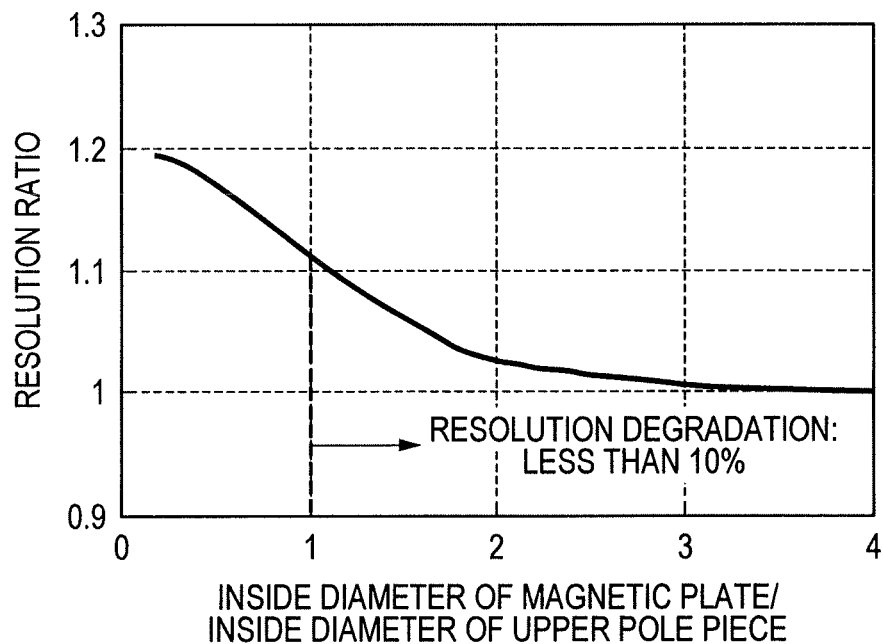
FIG. 8 is a graph representing a relationship between the inside diameter of the magnetic body and a resolution.

The magnetic body is disposed below the lower pole piece of the objective lens so that the principal plane of the objective lens moves toward the direction away from the sample surface, resulting in resolution degradation. The resolution degradation is closely related to the inside diameter of the magnetic body. As the inside diameter is made small, the principal plane moves apart from the sample surface, resulting in noticeable resolution degradation. FIG. 8 shows the calculation result with respect to the resolution degradation by changing the inside diameter of the magnetic body when observing the insulator sample at the representative acceleration voltage. The x-axis denotes the inside diameter ratio between the magnetic body and the upper pole piece of the objective lens, and the y-axis denotes the resolution ratio standardized as the configuration without the magnetic body. As the inside diameter of the magnetic body is made small, the resolution is degraded. The resolution of the structure in which the inside diameter of the magnetic body is the same as that of the objective lens is degraded by approximately 10%. When the structure has the magnetic body with smaller inside diameter, the resolution is degraded by approximately 20%. If the resolution degradation exceeds 10%, influence on the SEM image quality becomes noticeable, and the critical dimension measurement precision for the pattern is deteriorated. Accordingly, the inside diameter ratio between the magnetic body and the upper pole piece has to be set to 1 or higher in order to suppress the resolution degradation resulting from provision of the magnetic body to 10% or lower.

The result shown in FIG. 7 represents that it is necessary to set the inside diameter ratio between the magnetic body and the upper pole piece to 0.8 or higher, especially in the range from 1 to 2.5 for the purpose of obtaining the charging reduction effect as the advantage of provision of the magnetic body. Meanwhile, the result shown in FIG. 8 represents that it is necessary to set the inside diameter ratio between the magnetic body and the upper pole piece to 1 or higher for the purpose of suppressing the resolution degradation to 10% or lower where the critical dimension measurement precision for the pattern is deteriorated as disadvantage of provision of the magnetic body. In other words, it is necessary to make the inside diameter of the magnetic body larger than that of the upper pole piece of the objective lens. In consideration of the aforementioned results, the magnetic body is continuously formed having the inside diameter larger than that of the upper pole piece of the objective lens so as to realize reduction of the beam drift by reducing charging while keeping the low resolution degradation. If the measurement is intended mainly to reduce the beam drift, which allows further degradation of the resolution up to approximately 20%, the inside diameter ratio between the magnetic body and the upper pole piece may be set to 0.8 or higher. Use of the structure according to the embodiment reduces the beam drift to ½ or less without the resolution degradation compared with the state before provision of the magnetic body, thus reducing the image blur.

Second Embodiment

A second embodiment will be described referring to FIG. 9. The description of the first embodiment is applicable to this embodiment unless the circumstances are exceptional.

Figure 9:
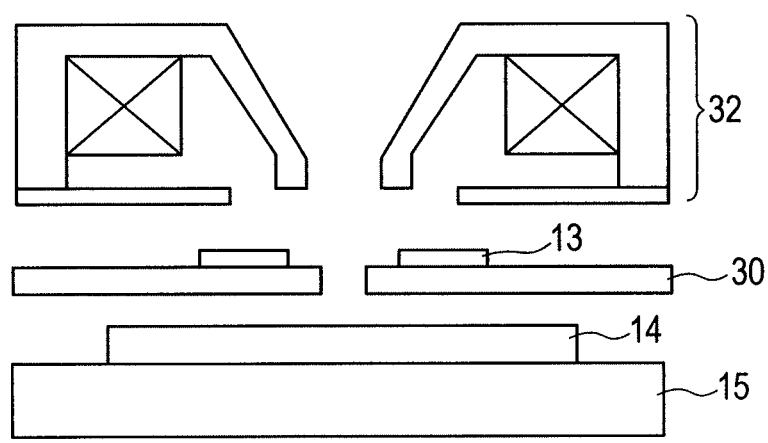
FIG. 9 is a view illustrating an objective lens and its periphery according to an embodiment in which a non-magnetic body is added to the magnetic body.

FIG. 9 illustrates a structure in which a non-magnetic body 30 is further disposed underneath the magnetic body 13 between the objective lens 32 and the sample 14. The sample 14 is held on the sample holder 15. The magnetic body 13 and the non-magnetic body 30 may be made conductive for the purpose of applying the same voltage, or may be insulated for the purpose of applying different voltage. The non-magnetic body 30 is disposed parallel to the sample holder 15, and is made larger than the magnetic body 13 so as to allow controlling of the potential on the sample surface. The non-magnetic body 30 functions to make it difficult to charge the insulating sample as well as suppress the beam drift by reducing the potential gradient on the sample surface.

Figure 10A:
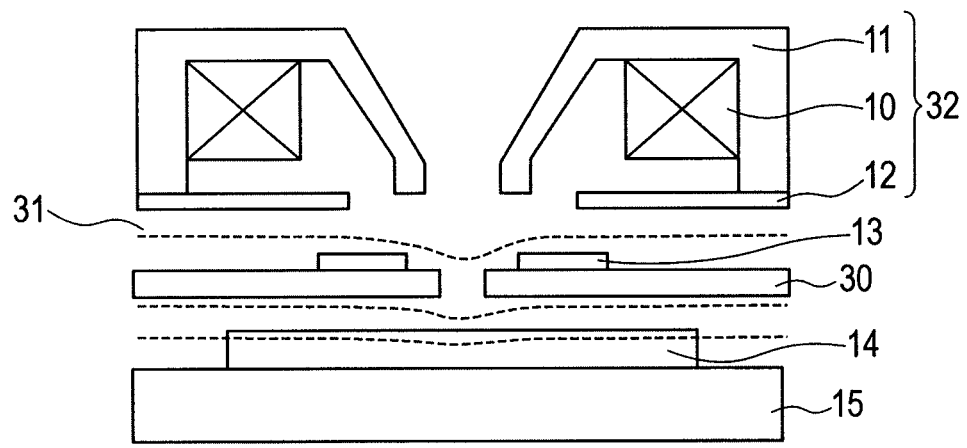
FIGS. 10A and 10B are views illustrating equipotential lines around the sample in accordance with change in the inside diameter of the non-magnetic body.
Figure 10B:
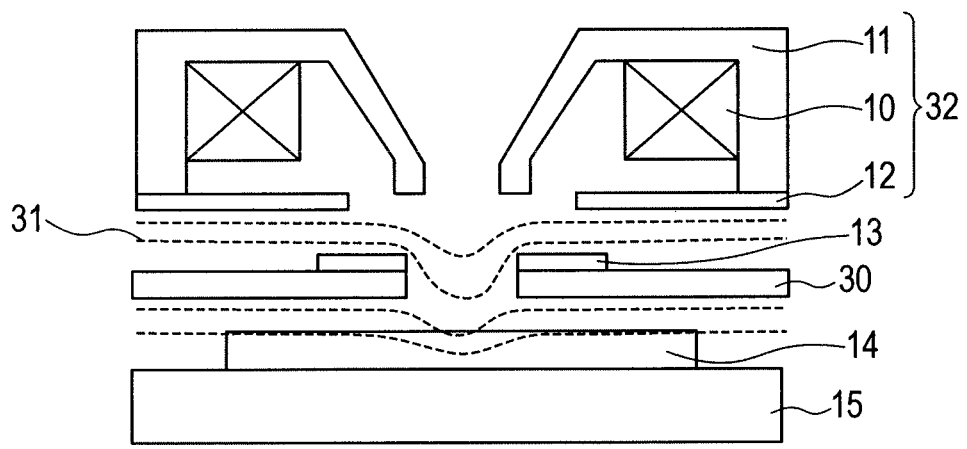

FIGS. 10A and 10B schematically show equipotential lines around the sample in accordance with change in the inside diameter of the non-magnetic body 30 for electron beam passage. FIG. 10A illustrates the structure having the inside diameter of the non-magnetic body smaller than that of the magnetic body. FIG. 10B illustrates the structure having the same inside diameter as that of the magnetic body. When the inside diameter of the non-magnetic body 30 is smaller than that of the magnetic body 13 (FIG. 10A), the equipotential line 31 is substantially parallel to the sample surface, and accordingly, the potential gradient in the lateral direction of the sample is small. The small lateral potential gradient provides the effect of suppressing generation of the beam drift. Therefore, it is preferable to set the inside diameter of the non-magnetic body as small as possible. Especially, the upper pole piece of the objective lens may cause the electric field to stray on the sample surface. Therefore it is preferable to set the inside diameter of the non-magnetic body to the size which is capable of sufficiently shielding the magnetic field of the upper pole piece. Specifically, the inside diameter of the non-magnetic body is made smaller than that of the upper pole piece to achieve the requirement. Meanwhile, when the inside diameter of the non-magnetic body is equal to (FIG. 10B) or larger than that of the magnetic body, the electric field of the upper pole piece of the objective lens strays on the sample surface. As a result, the equipotential line is no longer parallel to the sample surface, thus generating the lateral potential gradient. The resultant lateral potential gradient emphasizes the beam drift. It is therefore necessary to make the inside diameter of the non-magnetic body smaller than that of the upper pole piece for the purpose of reducing the beam drift by decreasing the potential gradient.

Figure 11:
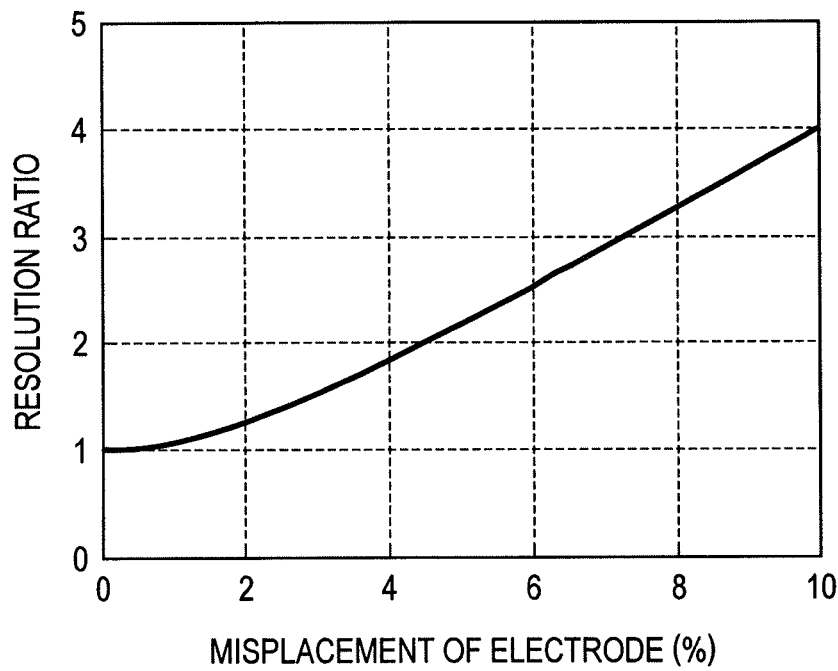
FIG. 11 is a graph representing a relationship between an electrode misplacement and the resolution.

The structure shown in FIGS. 10A and 10B includes three electrodes (upper pole piece of the objective lens, non-magnetic body, magnetic body) around the sample, which govern the resolution. The upper pole piece and the magnetic body form a magnetic lens, and the upper pole piece of the objective lens and the non-magnetic body form an electrostatic lens. Those electrodes are required to be disposed so that the respective central axes are coincided with one another for the purpose of obtaining the intended performance of the apparatus. Actually, however, it is rare that the respective central axes are completely coincided upon combination of those electrodes. The electrode misplacement is one of causes of the resolution degradation. It is known that contribution of the electrostatic lens to resolution degradation owing to the electrode misplacement is greater than the magnetic lens. FIG. 11 represents the calculation result of the resolution degradation which occurs upon misplacement of the non-magnetic body as one of the components of the electrostatic lens from the central axis of the other electrode. The x-axis denotes the misplacement of the non-magnetic body as a ratio (%) with respect to the inside diameter. The y-axis denotes the resolution expressed by the resolution ratio with respect to the one without misplacement of the non-magnetic body. In spite of only several % of the misplacement with respect to the inside direction of the non-magnetic body, the resolution is likely to be sharply degraded. In order to suppress the resolution degradation to 10% or lower, it is necessary to suppress the misplacement of the non-magnetic body within 1%. When the electrode is displaced from the original position, it is regarded that the electrode is not disposed in a rotationally symmetric manner with respect to the axis of the electron beam. As a result, charging becomes asymmetric, which may cause the beam drift. Therefore, the electrode position has to be aligned with higher precision for the purpose of reducing the beam drift as the problem to be solved.

Figure 12:
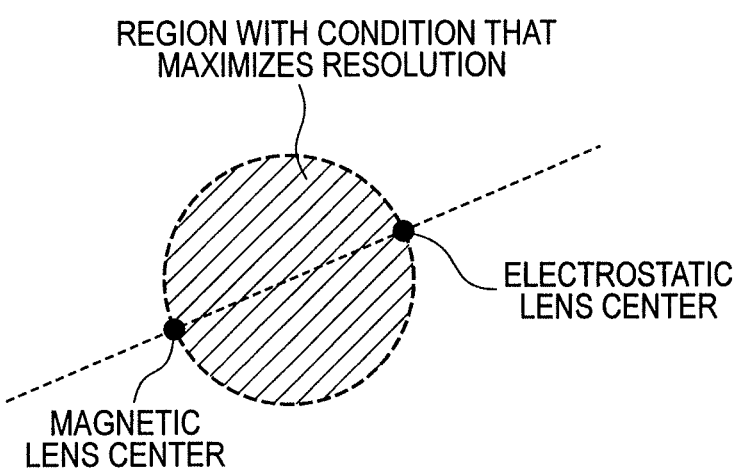
FIG. 12 is a view representing a relationship of centers of a magnetic lens and an electrostatic lens with a region that contains conditions for maximizing the resolution.

If the misplacement of the non-magnetic body is equal to or higher than 1%, the method of suppressing the resolution degradation by changing the electron beam axis may be employed. Specifically, the electron beam aligned with the center of the magnetic lens is brought in close to the center of the electrostatic lens so as to reduce the resolution degradation effect owing to misplacement of the electrostatic lens. As relationship between the electron beam position and the resolution largely depends on the misplacement of the electrode, it has to be adjusted in accordance with conditions of the apparatus. Generally, the condition where the resolution is maximized is obtained at a point in the shaded region between centers of the magnetic lens and the electrostatic lens as FIG. 12 shows. The region between the centers of two lenses corresponds to the inside of the circle having the diameter set as the line formed by connecting those centers. When the electrodes are combined again, and the misplacement occurs, it is necessary to retain the resolution by adjusting the electron beam position. The use of the structure according to the embodiment causes no resolution degradation, and significantly reduces the image blur by decreasing the beam drift to ⅙ or less compared with the state before provision of the magnetic body and the non-magnetic body.

Third Embodiment

Figure 13A:
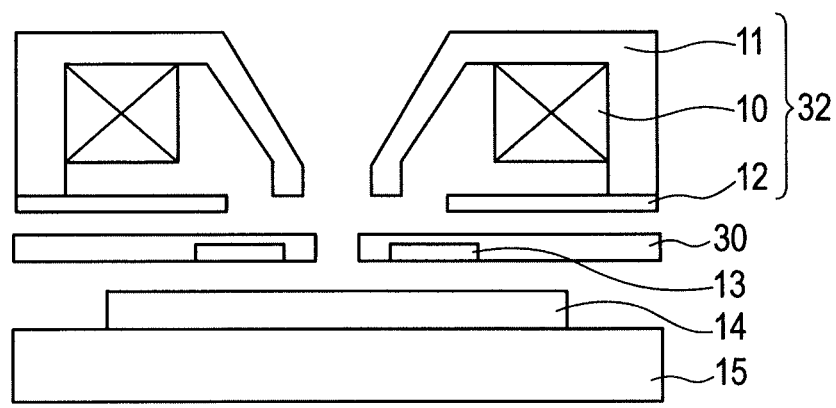
FIGS. 13A and 13B are views illustrating another embodiment of the structure shown in FIG. 9.
Figure 13B:
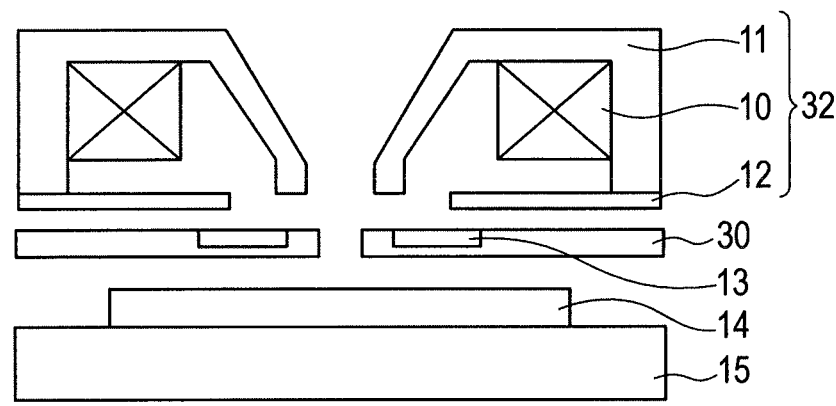

In the second embodiment, the non-magnetic body is disposed underneath the magnetic body. Such structure increases a working distance between the objective lens and the sample, and the principal plane of the objective lens is far from the sample, thus degrading the resolution. The aforementioned problem may be solved by forming a trench in the non-magnetic body for storage of the magnetic body. FIGS. 13A and 13B illustrate the structure in which the trench is formed in the non-magnetic body for storage of the magnetic body. FIG. 13A illustrates that the trench is formed in the lower side of the non-magnetic body. FIG. 13B illustrates that the trench is formed in the upper side of the non-magnetic body. The structure having the magnetic body fit in the trench provides the advantage of suppressing the resolution degradation by reducing the working distance as well as improvement of the electrode positioning precision. In Embodiments 2 and 3, three electrodes (upper pole piece, magnetic body, non-magnetic body) are provided, which influence the resolution of the electron beam. The respective center axes are coincided with one another to maximize the effect of the present invention. The method of using the trench for fitting and fixing the electrode in position may suppress the misplacement of the electrode within the working precision. This makes it possible to make the axis alignment more accurate than the method using the jig generally used for the axis alignment of the electrode.

The shape of the structure formed by combining the non-magnetic body and the magnetic body each functioning as the electrode influences the electric field on the sample surface. Especially the shape of the structure at the side of the sample surface becomes important. When the non-magnetic body is underneath the magnetic body as shown in FIG. 9, the equipotential line is parallel to the sample surface, and no magnetic gradient is generated in the lateral direction of the sample. When such arrangement is inverted, the structure has the shape close to the one shown in FIG. 3B, resulting in the potential gradient in the lateral direction of the sample. As the lateral potential gradient causes the beam drift, the surface of the electrode at the sample side has to be flat. In the structure having the trench formed at the side opposite the sample side (FIG. 13B), the surface at the sample side is covered with the non-magnetic body, thus generating no potential gradient. In the structure having the trench formed at the sample side (FIG. 13A), misplacement between surfaces of the magnetic body and the non-magnetic body may cause the potential gradient. Each height of the surfaces of the magnetic body and the non-magnetic body at the sample side has to be flush with each other. The aforementioned structure allows the magnetic body to be provided at the lower position of the non-magnetic body. The structure according to this embodiment improves the axis alignment precision more than twice as high as the structure according to the second embodiment. The working distance is reduced, thus improving the resolution by more than 10%.

REFERENCE SINGS LIST

1: field emission cathode, 2: extractor electrode, 3: emitted electron, 4: anode, 5: condenser lens, 6: diaphragm, 7: adjustment knob, 8: upper scan deflector, 9: lower scan deflector, 10: objective lens coil, 11: upper pole piece, 12: lower pole piece, 13: magnetic body, 14: sample, 15: sample holder, 16: secondary electron, 17: pull-up electrode, 18: scintillator, 19: light guide, 20: photomultiplier, 21: hole for electron beam passage, 24: equipotential line, 25: incident electron, 26: secondary electron, 27: positive charging, 28: detected electron, 29: electron returned to sample, 30: non-magnetic body, 31: equipotential line, 32: objective lens

The invention claimed is:

1. An electron microscope that provides an image using a secondary signal generated from a sample irradiated with an electron beam, the electron microscope comprising:
   an electron source;
   an objective lens that focuses the electron beam emitted from the electron source;
   a magnetic body provided between the objective lens and the sample; and
   a non-magnetic body provided between the objective lens and the sample; wherein:
   the magnetic body has a continuous structure and an inside diameter larger than an inside diameter of an upper pole piece that forms the objective lens,
   the non-magnetic body has a continuous structure and an inside diameter smaller than the inside diameter of the upper pole piece that forms the objective lens,
   the non-magnetic body has a trench that stores the magnetic body,
   the magnetic body is disposed in the trench, and
   the magnetic body is disposed at a position closer to the objective lens than the non-magnetic body.

2. The electron microscope according to claim 1, wherein the magnetic body has a rotationally symmetric opening at a substantially center location, through which the electron beam passes.

3. The electron microscope according to claim 1, wherein the magnetic body is a flat plate.

4. The electron microscope according to claim 1, wherein an outside diameter of the magnetic body is larger than an inside diameter of a lower pole piece that forms the objective lens.

5. The electron microscope according to claim 1, wherein the magnetic body is a pure iron or a permalloy.

6. The electron microscope according to claim 1, wherein the magnetic body and the objective lens are arranged so that respective central axes are substantially coincided with each other.

7. The electron microscope according to claim 1, wherein the non-magnetic body has a rotationally symmetric opening at substantially a center location, through which the electron beam passes.

8. The electron microscope according to claim 1, wherein the non-magnetic body is a flat plate.

9. The electron microscope according to claim 1, wherein an outside diameter of the non-magnetic body is larger than an outside diameter of the magnetic body.

10. The electron microscope according to claim 1, wherein the objective lens, the non-magnetic body and the magnetic body are arranged so that respective central axes are substantially coincided with one another.

11. The electron microscope according to claim 1, wherein the electron beam passes through a region between a center of a magnetic lens formed of the objective lens and the magnetic body and a center of an electrostatic lens formed of the objective lens and the non-magnetic body.

12. The electron microscope according to claim 1, wherein the electron microscope is a scanning electron microscope.

13. The electron microscope according to claim 1, wherein a ratio of the inside diameter of the magnetic body and the inside diameter of the upper pole piece that forms the objective lens is greater than 1 and smaller than 2.5.

14. An electron lens of an electron microscope used for inspection and measurement of a sample, the electron lens comprising:
- an objective lens;
- a magnetic body provided between the objective lens and the sample; and
- a non-magnetic body provided between the objective lens and the sample; wherein:
- the magnetic body has a continuous structure and an inside diameter larger than an inside diameter of an upper pole piece that forms an objective lens,
- the non-magnetic body has a continuous structure and an inside diameter smaller than the inside diameter of the upper pole piece that forms the objective lens,
- the non-magnetic body has a trench that stores the magnetic body,
- the magnetic body is disposed in the trench, and
- the magnetic body is disposed at a position closer to the objective lens than the non-magnetic body.

* * * * *